(12) United States Patent
Kurokawa et al.

(10) Patent No.: US 11,362,736 B2
(45) Date of Patent: Jun. 14, 2022

(54) OPTICAL TRANSMITTER MODULE, OPTICAL TRANSMITTER-RECEIVER MODULE, AND OPTICAL MODULE

(71) Applicant: Sumitomo Electric Industries, Ltd., Osaka (JP)

(72) Inventors: Munetaka Kurokawa, Osaka (JP); Hiroshi Hara, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 17/236,455

(22) Filed: Apr. 21, 2021

(65) Prior Publication Data

US 2021/0336702 A1 Oct. 28, 2021

(30) Foreign Application Priority Data

Apr. 27, 2020 (JP) .............................. JP2020-078161

(51) Int. Cl.
*H04B 10/50* (2013.01)
*H04B 10/40* (2013.01)
*H01S 5/024* (2006.01)
*H01S 5/00* (2006.01)

(52) U.S. Cl.
CPC ......... *H04B 10/503* (2013.01); *H01S 5/0085* (2013.01); *H01S 5/02415* (2013.01); *H04B 10/40* (2013.01)

(58) Field of Classification Search
CPC ..... H04B 10/503; H04B 10/40; H01S 5/0085; H01S 5/02415
USPC ....................................................... 398/135
See application file for complete search history.

(56) References Cited

U.S. PATENT DOCUMENTS

| | | | | |
|---|---|---|---|---|
| 2015/0098480 | A1* | 4/2015 | Matsuyama | ........ H01S 5/02325 372/34 |
| 2020/0303897 | A1* | 9/2020 | Misawa | .............. H01S 5/02345 |
| 2021/0013696 | A1* | 1/2021 | Wang | .................. H01S 5/02253 |
| 2021/0367399 | A1* | 11/2021 | Inaba | .................. H01S 5/02438 |

FOREIGN PATENT DOCUMENTS

JP 2019-140306 A 8/2019

\* cited by examiner

*Primary Examiner* — Dalzid E Singh
(74) *Attorney, Agent, or Firm* — Baker Botts L.L.P.; Michael A. Sartori (57) ABSTRACT

An optical transmitter module includes a semiconductor laser device, optical modulator, temperature adjusting device which includes a substrate, a first installation part and a second installation part, a package having a bottom surface opposite to a back surface of the substrate, the package housing the semiconductor laser device, the optical modulator, and the temperature adjusting device; and a middle block disposed between a first temperature controlling element a the second temperature controlling element, the middle block having a back surface directly or indirectly fastened to a principal surface of the substrate.

12 Claims, 9 Drawing Sheets

OPTICAL TRANSMITTER MODULE, OPTICAL TRANSMITTER-RECEIVER MODULE, AND OPTICAL MODULE

TECHNICAL FIELD

The present disclosure relates to an optical transmitter module, an optical transmitter-receiver module, and an optical module.

BACKGROUND

Japanese Unexamined Patent Publication No. 2019-140306 discloses a technique relating to an optical module. This optical module includes a plurality of components including at least one heating element and a thermoregulator. The thermoregulator has a lower substrate in a plate shape, a plurality of thermoelectric elements provided in different regions on the top surface of the lower substrate spaced at a predetermined distance, and a plurality of upper substrates provided on the top surfaces of the plurality of thermoelectric elements. The thermoregulator adjusts the temperature of a component provided on each of the top surfaces of the plurality of upper substrates by the Pertier effect.

SUMMARY

An optical transmitter module according to an embodiment includes a semiconductor laser device; an optical modulator optically coupled to the semiconductor laser device; a temperature adjusting device having a substrate having a principal surface and a back surface, a first installation part provided on the principal surface of the substrate through a first temperature controlling element, the first installation part having the semiconductor laser device installed on the first installation part, and a second installation part provided on the principal surface of the substrate through a second temperature controlling element, the second installation part having the optical modulator installed on the second installation part; a package having a bottom surface opposite to the back surface of the substrate, the package housing the semiconductor laser device, the optical modulator, and the temperature adjusting device; and a middle block disposed between the first temperature controlling element and the second temperature controlling element, the middle block having a back surface directly or indirectly fastened to the principal surface of the substrate.

An optical transmitter-receiver module according to an embodiment includes a semiconductor laser device; an optical modulator optically coupled to the semiconductor laser device; a light receiving element optically coupled to the semiconductor laser device; a temperature adjusting device having a substrate having a principal surface and a back surface, a first installation part provided on the principal surface of the substrate through a first temperature controlling element, the first installation part having the semiconductor laser device installed on the first installation part, and a second installation part provided on the principal surface of the substrate through a second temperature controlling element, the second installation part having the optical modulator installed on the second installation part, a package having a bottom surface opposite to the back surface of the substrate, the package housing the semiconductor laser device, the optical modulator, the light receiving element, and the temperature adjusting device; and a middle block disposed between the first temperature controlling element and the second temperature controlling element, the middle block having a back surface directly or indirectly fastened to the principal surface of the substrate.

An optical module according to an embodiment includes a first optical element and a second optical element optically coupled to each other; a temperature adjusting device having a substrate having a principal surface and a back surface, a first installation part provided on the principal surface of the substrate through a first temperature controlling element, the first installation part having the first optical element installed on the first installation part, a second installation part provided on the principal surface of the substrate through a second temperature controlling element, the second installation part having the second optical element installed on the second installation part; a package having a bottom surface opposite to the back surface of the substrate, the package housing the first optical element, the second optical element, and the temperature adjusting device; and a middle block disposed between the first temperature controlling element and the second temperature controlling element, the middle block having a back surface directly or indirectly fastened to the principal surface of the substrate.

DETAILED DESCRIPTION

Description of Embodiments of the Present Disclosure

First, embodiments of the present disclosure will be described in enumeration. An optical transmitter module according to an embodiment includes a semiconductor laser device; an optical modulator optically coupled to the semiconductor laser device; a temperature adjusting device having a substrate having a principal surface and a back surface, a first installation part provided on the principal surface of the substrate through a first temperature controlling element, the first installation part having the semiconductor laser device installed on the first installation part, and a second installation part provided on the principal surface of the substrate through a second temperature controlling element, the second installation part having the optical modulator installed on the second installation part; a package having a bottom surface opposite to the back surface of the substrate, the package housing the semiconductor laser device, the optical modulator, and the temperature adjusting device; and a middle block disposed between the first temperature controlling element and the second temperature controlling element, the middle block having a back surface directly or indirectly fastened to the principal surface of the substrate.

In the optical transmitter module, the laser light beam emitted from the semiconductor laser device is entered to the optical modulator, and the optical modulator modulates the laser light beam to generate an optical signal. The first temperature controlling element controls the temperature of the semiconductor laser device to control the wavelength of the laser light beam, and the second temperature controlling element keeps the temperature of the optical modulator at constant to suppress fluctuations in the characteristics of the optical modulator. Temperature control over the semiconductor laser device and the optical modulator is independently performed, and thus it is possible to highly accurately control these temperatures. In the optical transmitter module, the middle block is disposed between the first temperature controlling element and the second temperature controlling element, and the back surface of the middle block is directly or indirectly fastened to the principal surface of the substrate. Therefore, the middle block restrains the warpage of the substrate on which the first temperature controlling element and the second temperature controlling element are installed (specifically, the warpage of the part between the first temperature controlling element and the second temperature controlling element), and thus a reduction in the warpage of the substrate is enabled. Accordingly, a reduction in the relative inclination between the optical axis of the semiconductor laser device and the optical axis of the optical modulator is enabled, and thus suppressing the degradation in the efficiency of optical coupling is enabled. The stress produced on the temperature controlling elements due to the warpage of the substrate is reduced, and thus improving the reliability of the temperature controlling elements is enabled.

In the optical transmitter module, a length of a fastening region in which the principal surface of the substrate is fastened to the middle block in an arranging direction of the first installation part, the middle block, and the second installation part may be 10% or more and 50% or less of a length of the substrate in the arranging direction. The length of the fastening region is 10% or more of the length of the substrate, and thus the middle block enables effective restraint on the warpage of the substrate. Since the length of the fastening region is 50% or less of the length of the substrate, this enables a sufficient reservation of the space in which the first temperature controlling element and the second temperature controlling element are disposed on the principal surface of the substrate.

In the optical transmitter module, a width of a fastening region in which the principal surface of the substrate is fastened to the middle block in a direction orthogonal to an arranging direction of the first installation part, the middle block, and the second installation part may be 50% or more of a width of the substrate in the arranging direction. The width of the fastening region is 50% or more of a width of the substrate, and thus the middle block enables effective restraint on the warpage of the substrate.

In the optical transmitter module, a configuration may be provided in which a first metal film is provided on the principal surface of the substrate, a second metal film is provided on the back surface of the middle block, and the first metal film is fastened to the second metal film through a metal joining material. In this case, the middle block is firmly fastened to the substrate, the peeling of the middle block off the substrate due to the warpage of the substrate is avoided, and thus an effective restraint on the warpage of the substrate is enabled.

In the optical transmitter module, the principal surface of the substrate may be fastened to the back surface of the middle block through a resin. In this case, it is possible to easily fasten the middle block to the substrate, and it is possible to simplify manufacture processes.

In the optical transmitter module, on the principal surface of the middle block, a mark aligning the semiconductor laser device and the optical modulator with the middle block may be provided. In this case, it is possible to highly accurately align the relative position between the semiconductor laser device and the optical modulator having an increased spacing to each other with the middle block interposed.

In the optical transmitter module, a configuration may be provided in which the temperature adjusting device has an interconnection supplying a control signal to at least one of the first and second temperature controlling element on the principal surface of the substrate, the interconnection is disposed side by side with the fastening region in which the principal surface of the substrate is fastened to the middle block in the direction intersecting with the arranging direction of the first installation part, the middle block, and the second installation part, and the middle block may include a part covering the interconnection. In this case, an increase in the area of the middle block is enabled, and this enables a sufficient reservation of the space in which the optical component such as a beam splitter is disposed on the principal surface of the middle block.

The optical transmitter module described above may further include a first base member having an installation surface on which the semiconductor laser device is installed and a back surface directed to an opposite side of the installation surface, and a second base member having an installation surface on which the optical modulator is installed and a back surface directed to an opposite side of the installation surface, the middle block has a principal surface directed to an opposite side of the back surface, the back surface of the first base member is fixed to the first installation part, the back surface of the second base member is fixed to the second installation part, the installation surface of the first base member, the principal surface of the middle block, and the installation surface of the second base member are flush with each other. In this case, it is possible to highly accurately align the optical axes of the semiconductor laser device and the optical modulator in the height direction (in the normal direction of the principal surface of the substrate).

An optical transmitter-receiver module according to an embodiment includes a semiconductor laser device; an optical modulator optically coupled to the semiconductor laser device; a light receiving element optically coupled to the semiconductor laser device; a temperature adjusting device having a substrate having a principal surface and a back surface, a first installation part provided on the principal surface of the substrate through a first temperature controlling element, the first installation part having the semiconductor laser device installed on the first installation part, and a second installation part provided on the principal surface of the substrate through a second temperature controlling element, the second installation part having the optical modulator installed on the second installation part, a package having a bottom surface opposite to the back surface of the substrate, the package housing the semiconductor laser device, the optical modulator, the light receiving element, and the temperature adjusting device; and a middle block disposed between the first temperature controlling element and the second temperature controlling element, the middle block having a back surface directly or indirectly fastened to the principal surface of the substrate.

In the optical transmitter-receiver module, a part of the laser light beam emitted from the semiconductor laser device is entered to the optical modulator, and the optical modulator modulates the laser light beam to generate an optical signal. The remaining part of the laser light beam emitted from the semiconductor laser device is entered to the light receiving element, and the light receiving element demodulates the received optical signal using the laser light beam. The first temperature controlling element controls the temperature of the semiconductor laser device to control the wavelength of the laser light beam, and the second temperature controlling element keeps the temperature of the optical modulator at constant to suppress fluctuations in the characteristics of the optical modulator. Temperature control over the semiconductor laser device and the optical modulator is independently performed, and thus it is possible to highly accurately control these temperatures. In the optical transmitter-receiver module, the middle block is disposed between the first temperature controlling element and the second temperature controlling element, and the back surface of the middle block is directly or indirectly fastened to the principal surface of the substrate. Therefore, the middle block restrains the warpage of the substrate on which the first temperature controlling element and the second temperature controlling element are installed (specifically, the warpage of the part between the first temperature controlling element and the second temperature controlling element), and thus a reduction in the warpage of the substrate is enabled. Accordingly, a reduction in the relative inclination between the optical axis of the semiconductor laser device and the optical axis of the optical modulator is enabled, and thus suppressing the degradation in the efficiency of optical coupling is enabled. The stress produced on the temperature controlling elements due to the warpage of the substrate is reduced, and thus improving the reliability of the temperature controlling elements is enabled.

In the optical transmitter-receiver module, a configuration may be provided in which the middle block has a principal surface directed to an opposite side of the back surface, on the principal surface of the middle block, an optical component is disposed, the optical component branching an emission light beam from the semiconductor laser device, and one of the emission light beams having been branched is entered to the optical modulator, and another of the emission light beams having been branched is entered to the light receiving element. In this case, it is possible to enter a part of the laser light beam emitted from the semiconductor laser device to the optical modulator, and it is possible to enter the remaining part of the laser light beam emitted from the semiconductor laser device to the light receiving element. Such an optical component is disposed on the principal surface of the middle block, and thus efficient use of the space on the middle block is enabled.

In the optical transmitter-receiver module, a configuration may be provided in which the middle block has a principal surface directed to an opposite side of the back surface, the package has an installation surface provided side by side with the principal surface of the middle block, the installation surface on which the light receiving element is installed, and on the principal surface of the middle block and the installation surface of the package, a mark aligning the middle block with the package may be provided. In this case, it is possible to highly accurately align the relative position of the middle block to the package, resulting in enabling highly accurate optical coupling between the light receiving element and the semiconductor laser device disposed on the installation surface of the package.

An optical module according to an embodiment includes a first optical element and a second optical element optically coupled to each other; a temperature adjusting device having a substrate having a principal surface and a back surface, a first installation part provided on the principal surface of the substrate through a first temperature controlling element, the first installation part having the first optical element installed on the first installation part, a second installation part provided on the principal surface of the substrate through a second temperature controlling element, the second installation part having the second optical element installed on the second installation part; a package having a bottom surface opposite to the back surface of the substrate, the package housing the first optical element, the second optical element, and the temperature adjusting device; and a middle block disposed between the first temperature controlling element and the second temperature controlling element, the middle block having a back surface directly or indirectly fastened to the principal surface of the substrate.

In this optical module, the first temperature controlling element controls the temperature of the first optical element, and the second temperature controlling element controls the temperature of the second optical element. Temperature control over the first optical element and the second optical element is independently performed, and thus it is possible to highly accurately control these temperatures. In this optical module, the middle block is disposed between the first temperature controlling element and the second temperature controlling element, and the back surface of the middle block is directly or indirectly fastened to the principal surface of the substrate. Therefore, the middle block restrains the warpage of the substrate on which the first temperature controlling element and the second temperature controlling element are installed (specifically, the warpage of the part between the first temperature controlling element and the second temperature controlling element), and thus a reduction in the warpage of the substrate is enabled. Accordingly, in the relative inclination between the optical axes of the first optical element and the second optical element is reduced, and thus suppressing the degradation in the efficiency of optical coupling is enabled. The stress produced on the temperature controlling elements due to the warpage of the substrate is reduced, and thus improving the reliability of the temperature controlling elements is enabled.

Detail of the Embodiments of the Present Disclosure

In the following, specific examples of an optical transmitter module, an optical transmitter-receiver module, and an optical module according to the present disclosure will be described with reference to the drawings. Note that the present invention is not limited to these examples, but rather the intention is that all modifications described in the claims, equivalent to the meanings described in claims, and in the scope of claims are included. In the following description, in the description of the drawings, the same components are designated with the same reference signs, and the duplicated description is omitted.

Figure 1:
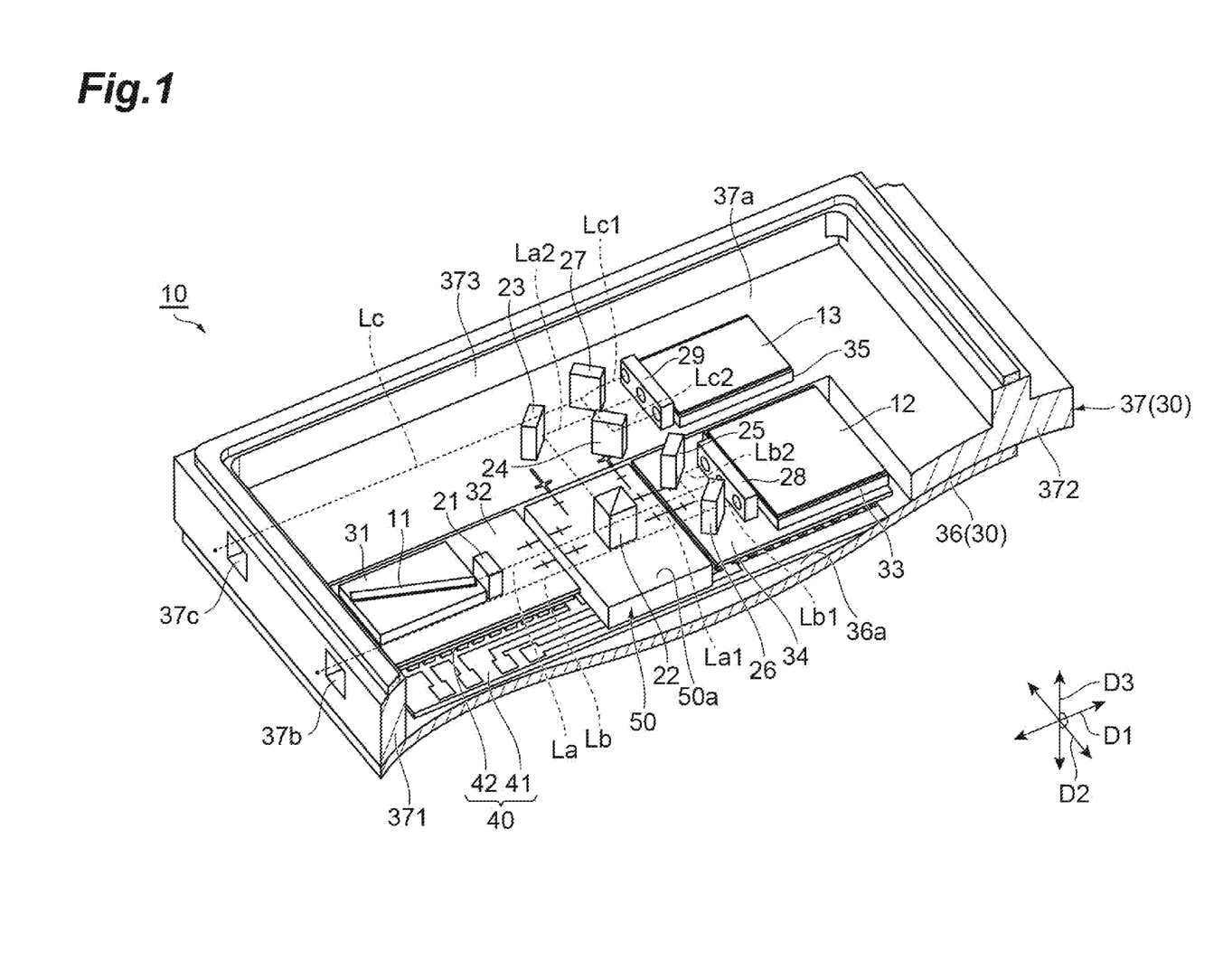
FIG. 1 is a cutaway perspective view showing the configuration of an optical transmitter-receiver module according to an embodiment of the present disclosure.
Figure 2:
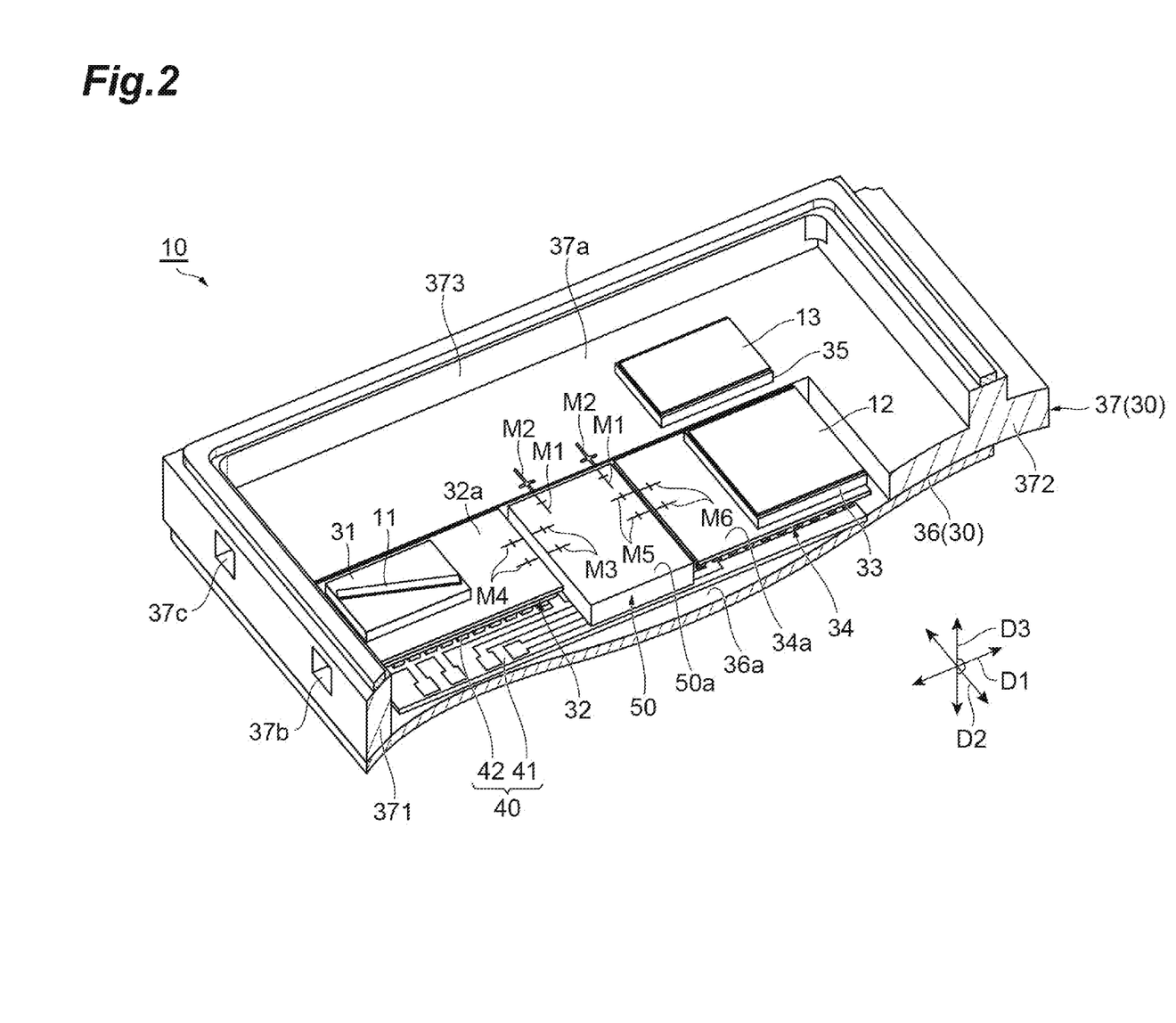
FIG. 2 is a cutaway perspective view of the optical transmitter-receiver module with its optical components omitted.
Figure 3:
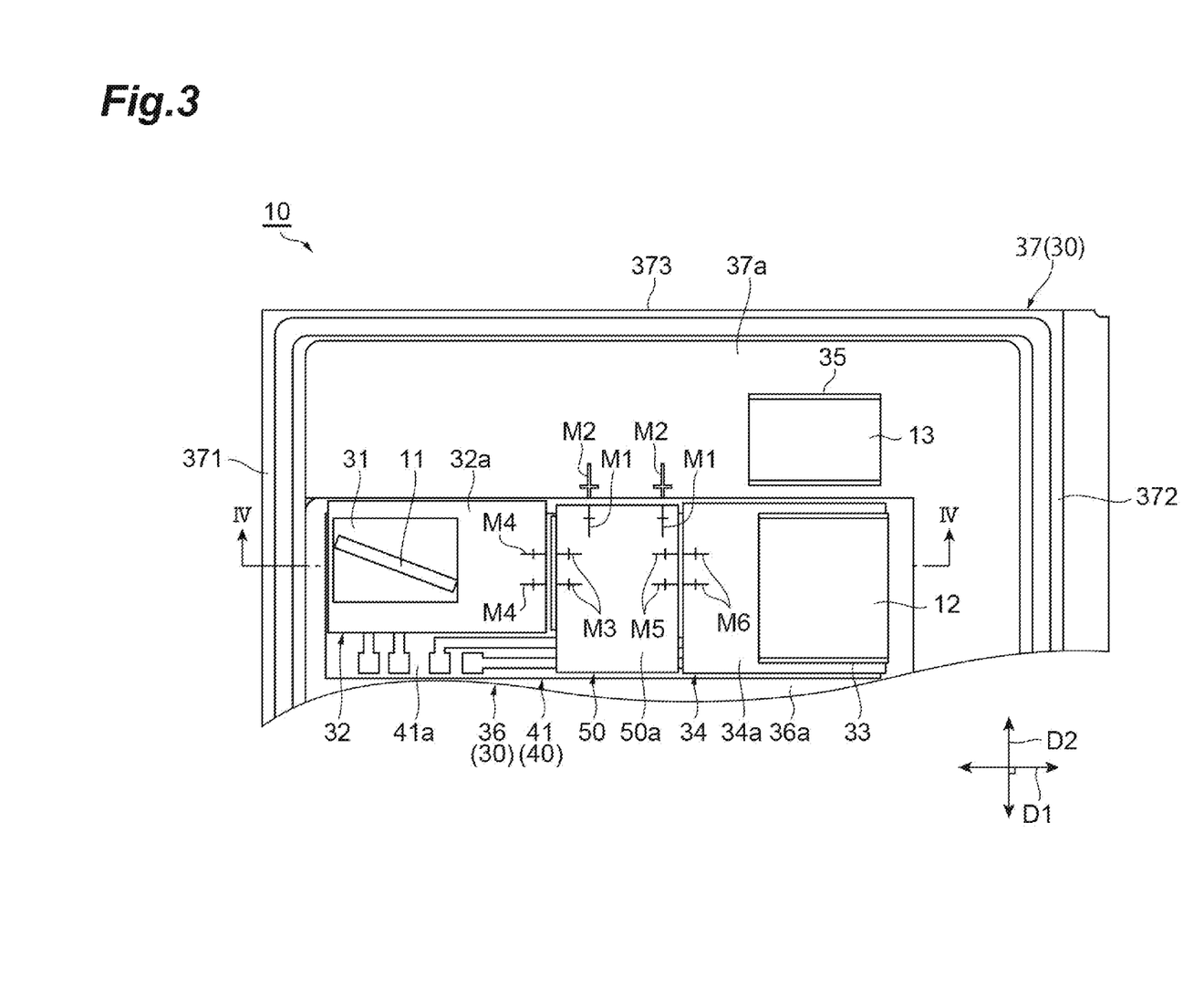
FIG. 3 is a partial plan view of the optical transmitter-receiver module shown in FIG. 2.
Figure 4:
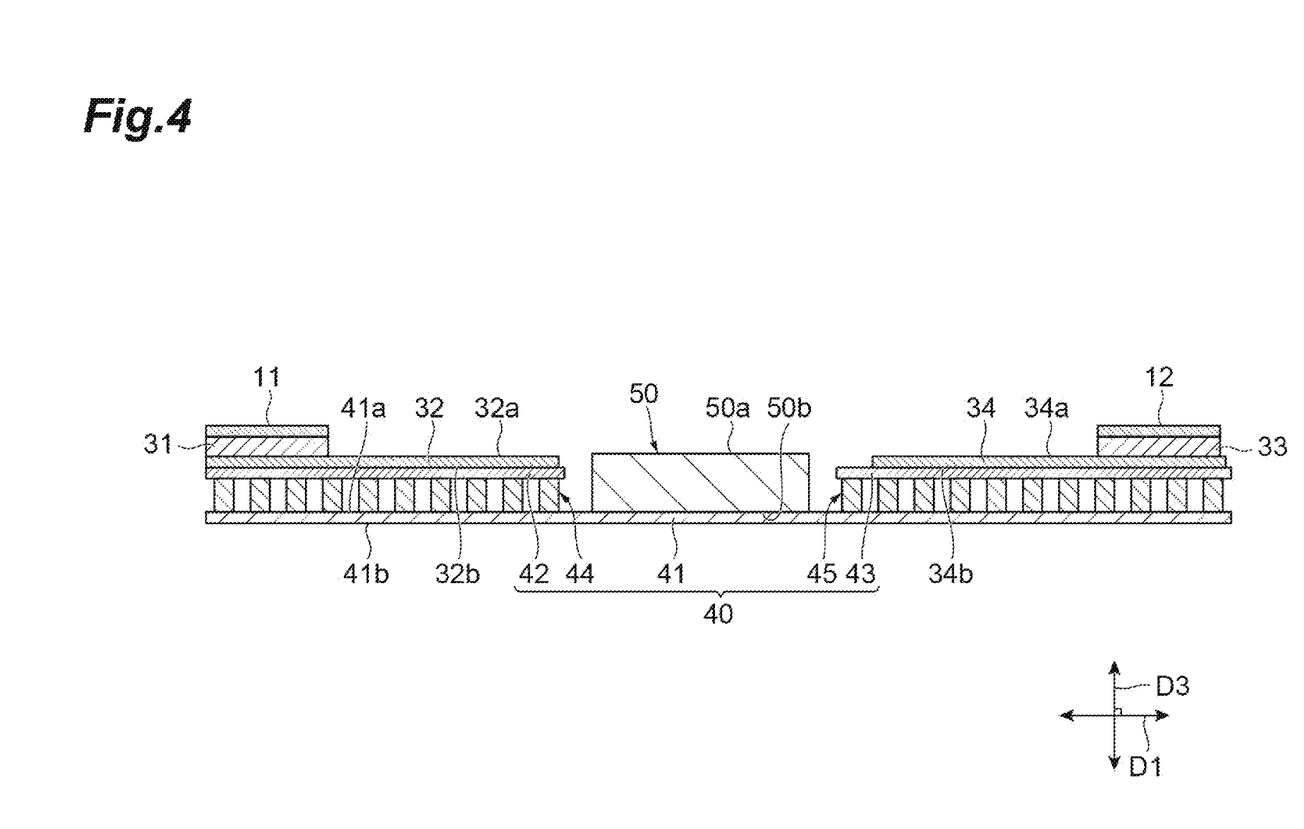
FIG. 4 is a cross sectional view taken along line IV-IV in FIG. 3.

FIG. 1 is a cutaway perspective view showing the configuration of an optical transmitter-receiver module 10 according to an embodiment of the present disclosure. FIG. 2 is a cutaway perspective view of the optical transmitter-receiver module 10 with its optical components omitted. FIG. 3 is a partial plan view of the optical transmitter-receiver module 10 shown in FIG. 2. FIG. 4 is a cross sectional view taken along line IV-IV in FIG. 3. The optical transmitter-receiver module 10 is an example of optical module in the present embodiment. As shown in FIGS. 1 to 4, the optical transmitter-receiver module 10 according to the present embodiment includes a semiconductor laser device 11, an optical modulator 12 optically coupled to the semiconductor laser device 11, and a light receiving element 13 optically coupled to the semiconductor laser device 11. In addition to this, the optical transmitter-receiver module 10 includes a lens 21, a beam splitter 22, the mirrors 23, 24, and 25, a polarized wave combining filter 26, a polarized wave separating filter 27, and lens arrays 28 and 29. Moreover, the optical transmitter-receiver module 10 includes a package 30, a light source carrier 31, a light source base 32, a modulator carrier 33, a modulator base 34, a receiving element carrier 35, a temperature adjusting device 40, and a middle block 50.

The semiconductor laser device 11 is an example of a first optical element of the present embodiment. The semiconductor laser device 11 is a Distributed Feedback (DFB) laser, for example, and emits a laser light beam La that is a continuous wave at a single wavelength from its one end. The semiconductor laser device 11 has a configuration that makes an emission wavelength variable. In an example, the semiconductor laser device 11 is an InP-based semiconductor laser device. The semiconductor laser device 11 is installed on the light source carrier 31, and is disposed such that the optical axis of the laser light beam La is along a direction D1. The light source carrier 31 is a member in a plate shape whose planar shape is in a rectangle, and is formed of a dielectric material. The dielectric material is a ceramic, for example, and the ceramic contains at least one of aluminum nitride and alumina, for example. On the top surface of the light source carrier 31, a plurality of interconnections that supplies a drive-electric current, for example, is supplied to the semiconductor laser device 11 is provided.

The lens 21 is disposed on the optical axis of the laser light beam La, and is optically coupled to one end of the semiconductor laser device 11. The lens 21 is a convex lens, for example, and collimates the laser light beam La emitted from the semiconductor laser device 11. The lens 21 is made of glass or silicon, for example.

The light source base 32 is an example of a first base member of the present embodiment. The light source base 32 is a member in a plate shape whose planar shape is in a rectangle, and is formed of a dielectric material. The dielectric material is a ceramic, for example, and the ceramic contains at least one of aluminum nitride and alumina, for example. As shown in FIG. 4, the light source base 32 has a flat installation surface 32a on which the semiconductor laser device 11 is installed and a back surface 32b directed to the opposite side of the installation surface 32a. The light source carrier 31 and the lens 21 are installed on the installation surface 32a of the light source base 32. The light source carrier 31 is fixed to the installation surface 32a using solder, for example. The lens 21 is fixed to the installation surface 32a using a resin adhesive, for example.

The beam splitter 22 is disposed on the optical axis of the laser light beam La, and is optically coupled to one end of the semiconductor laser device 11 through the lens 21. The beam splitter 22 is an optical component that branches the laser light beam La emitted from the semiconductor laser device 11 into two laser light beams La1 and La2. The one laser light beam La1 penetrates the beam splitter 22, and travels straight along the direction D1. The other laser light beam La2 reflects off the beam splitter 22, and travels along a direction D2 intersecting with (e.g. orthogonal to) the direction D1. The beam splitter 22 is formed of a dielectric multi-layer film formed on the surface of a glass block, for example.

The mirror 23 is disposed in the direction D2 to the beam splitter 22, and is optically coupled to the beam splitter 22. The mirror 23 again reflects the laser light beam La2 having reflected off the beam splitter 22. The laser light beam La2 having reflected off the mirror 23 again travels along the direction D1.

The lens array 28 includes three lenses arranged along the direction D2. Among these three lenses, the center lens is disposed in the direction D1 to the beam splitter 22, and is optically coupled to the beam splitter 22. The center lens condenses the laser light beam La1 having penetrated the beam splitter 22 toward the optical modulator 12. The lens array 29 includes three lenses arranged along the direction D2. Among these three lenses, the center lens is disposed in the direction D1 to the mirror 23, and is optically coupled to the mirror 23. The center lens condenses the laser light beam La2 having reflected off the mirror 23 toward the light receiving element 13. The lenses of the lens arrays 28 and 29 are made of glass or silicon, for example.

The optical modulator 12 is an example of a second optical element of the present embodiment. The optical modulator 12 receives the laser light beam La1, branches the laser light beam La1 in its inside, individually modulates the branched laser light beams, and thus generates two signal light beams Lb1 and Lb2. The modulation mode at the optical modulator 12 is phase shift keying (PSK). In the following, the case of quadrature phase shift keying (QPSK) will be described. The optical modulator 12 is formed of an InP-based or silicon (Si)-based semiconductor, for example, and includes a plurality of electroabsorption (EA) optical modulators that modulates light intensity in its inside. The optical modulator 12 is installed on the modulator carrier 33 that adjusts height. The modulator carrier 33 is a member in a plate shape whose planar shape is in a rectangle, and is formed of a dielectric material. The dielectric material is a ceramic, for example, and the ceramic contains at least one of aluminum nitride and alumina, for example. The optical modulator 12 emits the generated two signal light beams Lb1 and Lb2 from a pair of emission ports disposed sandwiching the incident port of the laser light beam La1. The signal light beams Lb1 and Lb2 emitted from the pair of emission ports travel along the direction D1 in the direction reverse to the laser light beam La1. The pair of emission ports is individually optically coupled to the lenses at two ends of the three lenses of the lens array 28, and the signal light beams Lb1 and Lb2 are collimated at the lenses at the two ends. The mirror 25 is optically coupled to one of the pair of emission ports of the optical modulator 12 through the lens array 28. The mirror 25 reflects the signal light beam Lb1 emitted from the one emission port toward the polarized wave combining filter 26. The signal light beam Lb1 after that travels along the direction D2 intersecting with (e.g. orthogonal to) the direction D1.

The polarized wave combining filter 26 is optically coupled to the other optical emission port of the optical modulator 12 through the lens array 28, and receives the collimated signal light beam Lb1. The polarized wave combining filter 26 is optically coupled to the mirror 25, and receives the signal light beam Lb2 having reflected off the mirror 25. Note that one of the signal light beams Lb1 and Lb2 has its polarization direction rotated at an angle of 90° by a retardation plate (not shown) provided in the inside or the outside of the optical modulator 12 until the one signal light beam reaches the polarized wave combining filter 26. The polarized wave combining filter 26 reflects the signal light beam Lb1 and penetrates the signal light beam Lb2, and thus combines the signal light beam Lb1 with the signal light beam Lb2, and emits a combined transmission signal light beam Lb to the outside of the optical transmitter-receiver module 10. The polarized wave combining filter 26 is formed of a dielectric multi-layer film formed on the surface of a glass block, for example.

The modulator base 34 is an example of a second base member of the present embodiment. The modulator base 34 is a member in a plate shape whose planar shape is in a rectangle, and is formed of a dielectric material. The dielectric material is a ceramic, for example, and the ceramic contains at least one of aluminum nitride and alumina, for example. As shown in FIG. 4, the modulator base 34 has a flat installation surface 34a on which the optical modulator 12 is installed and a back surface 34b directed to the opposite side of the installation surface 34a. The modulator carrier 33, the mirror 25, the polarized wave combining filter 26, and the lens array 28 are installed on the installation surface 34a of the modulator base 34, and fixed to the installation surface 34a with solder or a resin adhesive, for example.

The polarized wave separating filter 27 receives a reception signal light beam Lc entered from the outside of the optical transmitter-receiver module 10. The reception signal light beam Lc includes two signal light beams Lc1 and Lc2 whose polarization directions are different from each other. The polarized wave separating filter 27 separates the reception signal light beam Lc into two signal light beams Lc1 and Lc2. The polarized wave separating filter 27 is formed of a dielectric multi-layer film formed on the surface of a glass block, for example. The polarized wave separating filter 27 is optically coupled to one of the incident ports of the light receiving element 13 through the lens at one end among the three lenses of the lens array 29. The one signal light beam Lc1 separated through the polarized wave separating filter 27 is entered to one of the incident ports of the light receiving element 13 while being condensed by the lens at one end of the lens array 29.

The mirror 24 is disposed in the direction D2 to the polarized wave separating filter 27. The mirror 24 is optically coupled to the polarized wave separating filter 27 and is optically coupled to the other of the incident ports of the light receiving element 13 through the lens at the other end among the three lenses of the lens array 29. The other signal light beam Lc2 separated through the polarized wave separating filter 27 travels along the direction D2, then reflects off the mirror 24, travels along the direction D1, and is entered to the other of the incident ports of the light receiving element 13 while being condensed by the lens at the other end of the lens array 29.

The light receiving element 13 is a semiconductor device that demodulates the reception signal light beam Lc entered from the outside of the optical transmitter-receiver module 10 and converts the light beam Lc into an electrical signal, and the light receiving element 13 is installed on the receiving element carrier 35. The light receiving element 13 has an InP-based or Si-based semiconductor, for example, as a principal constituent material. The receiving element carrier 35 is formed of a dielectric material. The dielectric material is a ceramic, for example, and the ceramic contains at least one of aluminum nitride and alumina, for example. The reception signal light beam Lc of the present embodiment is a signal light beam modulated by PSK, and the light receiving element 13 is a so-called optical 90-degree hybrid device. Specifically, the light receiving element 13 has two signal light beam incident ports and one local emission light incident port. These light incident ports are disposed on one side surface of the light receiving element 13, and the local emission light incident port is located between the two signal light beam incident ports. One of the signal light beam incident ports is optically coupled to the polarized wave separating filter 27 through the lens array 29, and the signal light beam Lc1 is entered to the signal light beam incident port while being condensed by the lens of the lens array 29. The other of the signal light beam incident ports is optically coupled to the mirror 24 through the lens array 29, and the signal light beam Lc2 is entered to the signal light beam incident port while being condensed by the lens of the lens array 29. The local emission light incident port is optically coupled to the mirror 23 through the lens array 29, and the laser light beam La2 is entered to the local emission light incident port as a local emission light beam while being condensed by the lens of the lens array 29.

The light receiving element 13 causes the signal light beams Lc1 and Lc2 interfere with the laser light beam (the local emission light beam) La2. Thus, the light receiving element 13 demodulates information included in the signal light beams Lc1 and Lc2. Specifically, the light receiving element 13 includes a multimode interference waveguide (MMI waveguide) and a photodiode optically coupled to this waveguide. The MMI waveguide is an optical waveguide formed on an InP substrate, for example. The laser light beam La2 is entered from the local emission light incident port to the light receiving element 13, and then branched to two local emission light beams. The MMI waveguide causes the signal light beam Lc1 to optically interfere with one of the local emission light beams branched from the laser light beam La2 for homodyne detection or heterodyne detection. Thus, the MMI waveguide separates information included in the signal light beam Lc1 into an in-phase phase component of the local emission light beam and a phase component different at an angle of 90 degrees from the phase of the local emission light beam for demodulation. That is, the light receiving element 13 demodulates two independent pieces of information on the signal light beam Lc1. Similarly, the MMI waveguide causes the signal light beam Lc2 to optically interfere with the other of the local emission light beams branched from the laser light beam La2 for homodyne detection or heterodyne detection. Thus, the MMI waveguide separates information included in the signal light beam Lc2 into an in-phase phase component of the local emission light beam and a phase component different at an angle of 90 degrees from the phase of the local emission light beam for demodulation. That is, the light receiving element 13 demodulates two independent pieces of information also on the signal light beam Lc2. Four independent pieces of information demodulated by the light receiving element 13 are subjected to signal processing, and then guided to the outside of the optical transmitter-receiver module 10.

The temperature adjusting device 40 is a component that independently controls the temperatures of the semiconductor laser device 11 and the optical modulator 12. As shown in FIG. 4, the temperature adjusting device 40 has a lower substrate 41, two upper substrates 42 and 43, and two Peltier elements 44 and 45. The lower substrate 41 is a member in a plate shape having a principal surface 41a and a back surface 41b. The planar shape of the lower substrate 41 is a rectangle having the direction D1 being the long-side direction. The length of the lower substrate 41 in the direction D1 is 15 mm, for example, and the width of the lower substrate 41 in the direction D2 is 5 mm, for example. The lower substrate 41 is formed of a dielectric material. The dielectric material is a ceramic, for example, and the ceramic contains at least one of aluminum nitride and alumina, for example.

The upper substrate 42 is an example of a first installation part of the present embodiment. The upper substrate 42 is a member in a plate shape whose planar shape is a rectangle having the direction D1 as the long-side direction. The length of the upper substrate 42 in the direction D1 is 5 mm, for example, and the width of the upper substrate 42 in the direction D2 is 4 mm, for example. The upper substrate 42 is provided on the principal surface 41a of the lower substrate 41 through the Peltier element 44, and the semiconductor laser device 11 is installed on the upper substrate 42. Specifically, the upper substrate 42 is provided on the Peltier element 44 as the direction intersecting with D3 intersecting with (e.g. orthogonal to) both of the direction D1 and the direction D2 as the thickness direction, and on the substrate surface of the upper substrate 42 on the opposite side of the Peltier element 44, the back surface 32b of the light source base 32 is fixed. In an example, the light source base 32 is joined to the upper substrate 42 through a metal joining material.

The upper substrate 43 is an example of a second installation part of the present embodiment. The upper substrate 43 is a member in a plate shape whose planar shape is a rectangle having the direction D1 as the long-side direction. The length of the upper substrate 43 in the direction D1 is 6 mm, for example, and the width of the upper substrate 43 in the direction D2 is 5 mm, for example. As described above, the upper substrate 43 is shorter than the upper substrate 42 in the direction D1, and the upper substrate 43 is longer than the upper substrate 42 in the direction D2. The upper substrate 43 is provided on the principal surface 41a of the lower substrate 41 through the Peltier element 45, and the optical modulator 12 is installed on the upper substrate 43. Specifically, the upper substrate 43 is provided on the Peltier element 45 as the direction D3 is the thickness direction, and on the substrate surface of the upper substrate 43 on the opposite side of the Peltier element 45, the back surface 34b of the modulator base 34 is fixed. In an example, the modulator base 34 is joined to the upper substrate 43 through the metal joining material. The upper substrate 42 and the upper substrate 43 are arranged being spaced in the direction D1.

The Peltier element 44 is an example of a first temperature controlling element of the present embodiment. The Peltier element 45 is an example of a second temperature controlling element of the present embodiment. The Peltier elements 44 and 45 are arranged being spaced along the direction D1 on the principal surface 41a of the lower substrate 41. The Peltier elements 44 and 45 are driven with electric power supplied from the outside of the optical transmitter-receiver module 10 and transfer heat between the upper substrates 42 and 43 and the lower substrate 41. The constituent materials of the Peltier elements 44 and 45 are Bi—Sb—Te—Se, for example.

The middle block 50 is a member in a thick plate shape disposed between the Peltier element 44 and the Peltier element 45. In other words, on the principal surface 41a of the lower substrate 41, the Peltier element 44, the middle block 50, and the Peltier element 45 are arranged in this order along the direction D1. In the example shown in FIG. 4, the planar shape of the middle block 50 is in a rectangle having the direction D2 being the long-side direction. The length of the middle block 50 in the direction D2 is 5 mm, for example, and the width of the middle block 50 in the direction D1 is 4 mm, for example. As described above, the middle block 50 is shorter than the upper substrates 42 and 43 in the direction D1, and the middle block 50 is longer than the upper substrates 42 and 43 in the direction D2. The middle block 50 is formed of at least one of the metal material and the dielectric material. The dielectric material is a ceramic, for example, and the ceramic contains at least one of aluminum nitride and alumina, for example. The middle block 50 has a principal surface 50a and a back surface 50b directed to the opposite side of the principal surface 50a. The principal surface 50a and the back surface 50b are in parallel with each other. In the example shown in FIG. 4, the back surface 50b of the middle block 50 is directly fastened to the principal surface 41a of the lower substrate 41. Note that the back surface 50b of the middle block 50 may be indirectly fastened to the principal surface 41a of the lower substrate 41 through another member.

As shown in FIG. 4, the installation surface 32a of the light source base 32, the principal surface 50a of the middle block 50, and the installation surface 34a of the modulator base 34 are arranged in this order in the direction D1, and are flush with each other. In other words, the installation surfaces 32a and 34a and the principal surface 50a are matched with each other in the normal direction, and the heights relative to the principal surface 41a of the lower substrate 41 are equal to each other. As shown in FIG. 1, on the principal surface 50a of the middle block 50, the beam splitter 22 is disposed. In the example shown in FIG. 4, the installation surface 32a and the principal surface 50a are adjacent to each other with nothing interposed. Similarly, the installation surface 34a and the principal surface 50a are adjacent to each other with nothing interposed.

Figure 5:
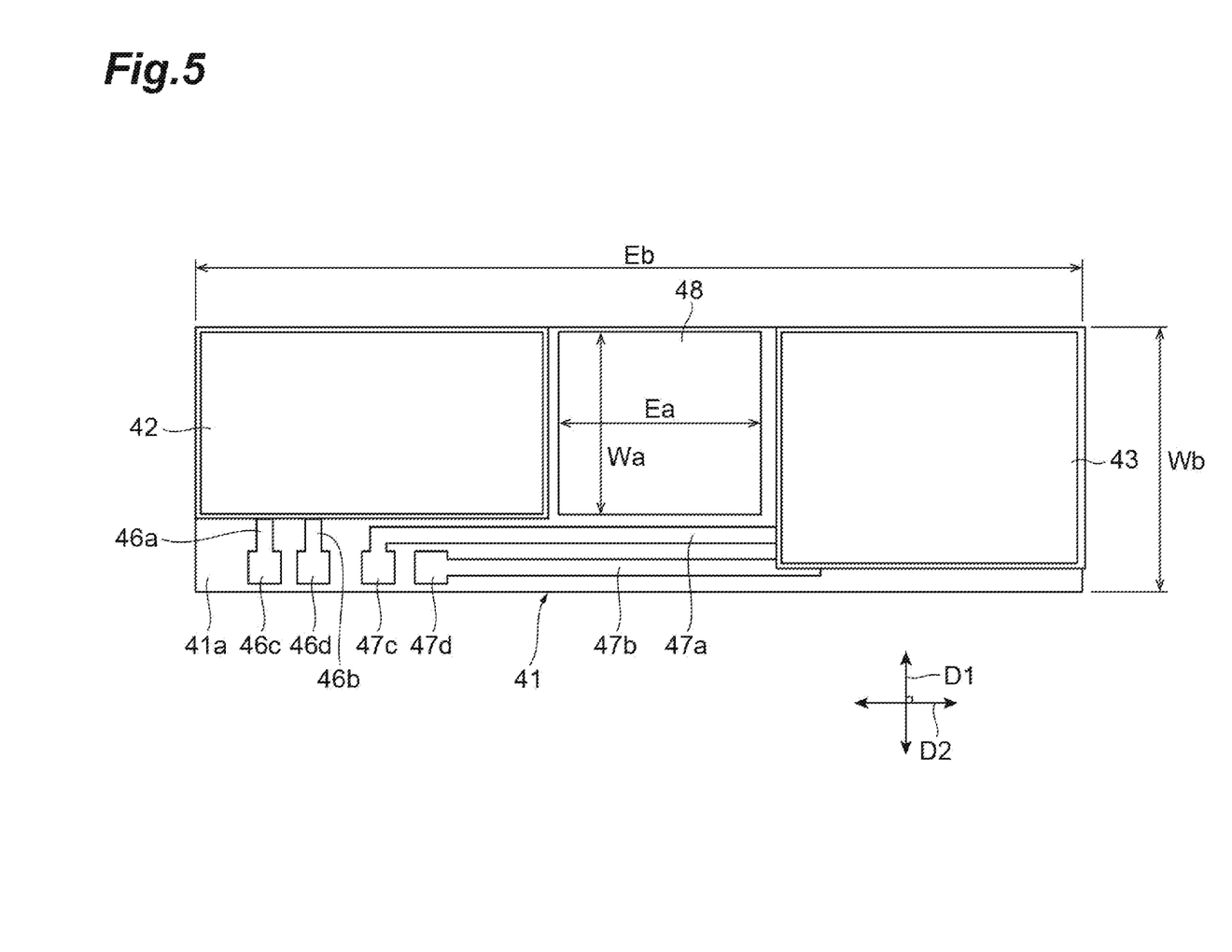
FIG. 5 is a plan view showing a temperature adjusting device.

FIG. 5 is a plan view showing the temperature adjusting device 40. As shown in FIG. 5, on the principal surface 41a of the lower substrate 41, a metal pattern 48 (a first metal film) is provided. The metal pattern 48 is formed between the mounting region of the Peltier element 44 and the mounting region of the Peltier element 45 on the principal surface 41a, and its planar shape is in a rectangle or a square, for example. In the case in which the planar shape of the metal pattern 48 is in a rectangle or a square, one edge of the planar shape is along the direction D1, and another one edge is along the direction D2. The metal pattern 48 is a film formed of a metal material on the principal surface 41a by vapor-deposition or plating, for example. In an example, the metal pattern 48 includes a Ni layer vapor-deposited on the principal surface 41a and an Au layer plated on the Ni layer.

Figure 6:
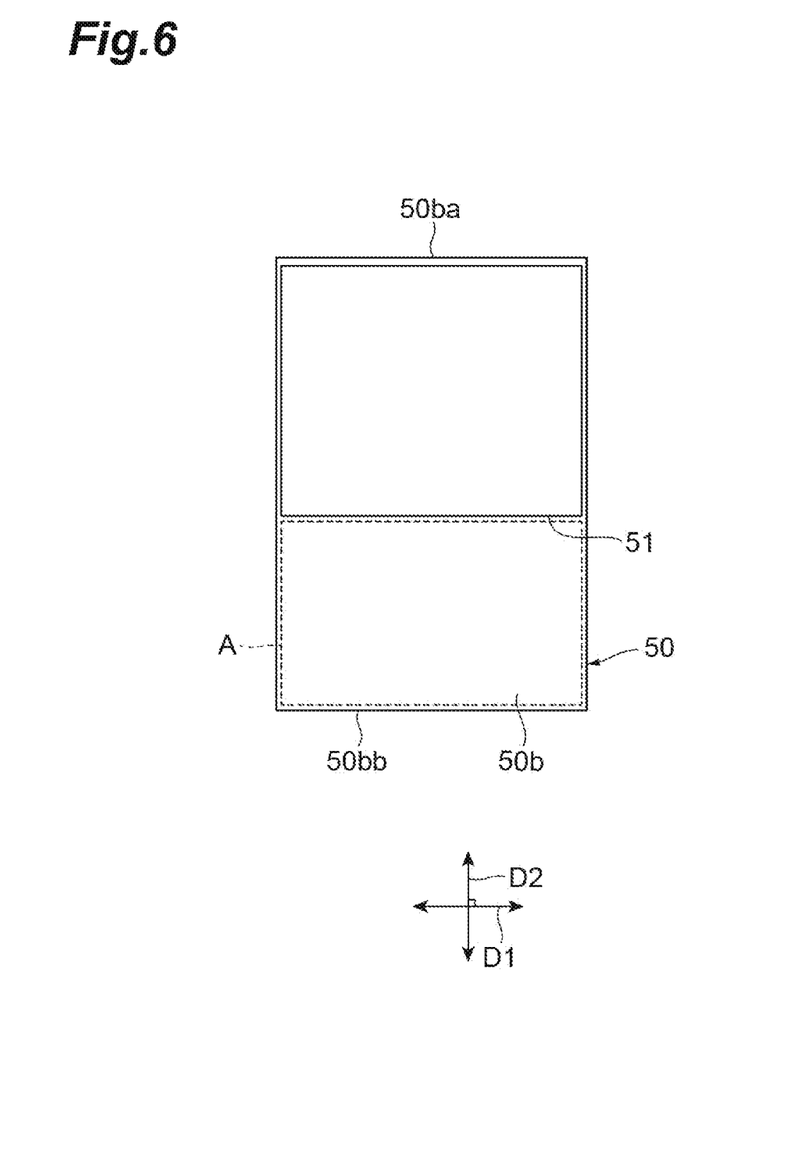
FIG. 6 is a bottom view showing the back surface of a middle block.

FIG. 6 is a bottom view showing the back surface 50b of the middle block 50. As shown in FIG. 6, on the back surface 50b of the middle block 50, a metal pattern 51 (a second metal film) is provided. The metal pattern 51 is formed close to one end 50ba of the back surface 50b in the direction D2, and its planar shape is in a rectangle or a square, for example. In the case in which the planar shape of the metal pattern 51 is in a rectangle or a square, one edge of the planar shape is along the direction D1, and another edge is along the direction D2. The metal pattern 51 is a film formed of a metal material on the back surface 50b by vapor-deposition or plating, for example. In an example, the metal pattern 51 includes a Ti layer vapor-deposited on the back surface 50b, a Pt layer vapor-deposited on the Ti layer, and an Au layer plated on the Pt layer. The metal pattern 51 of the middle block 50 is then joined to the metal pattern 48 of the lower substrate 41 through a metal joining material, and thus the back surface 50*b* of the middle block 50 is fastened to the principal surface 41*a* of the lower substrate 41. Therefore, in the principal surface 41*a*, the region of occupied by the metal pattern 48 matches with a fastening region in which the lower substrate 41 is fastened to the middle block 50. The metal joining material is SuAgCu-based solder, for example.

A length Ea of the metal pattern 48 (the fastening region) in the direction D1 (see FIG. 5) is 10% or more and 50% or less of a length Eb of the lower substrate 41 in the direction D1, for example. The width Wa of the metal pattern 48 (the fastening region) in the direction (e.g. in the direction D2) orthogonal to the direction D1 is 50% or more of a width Wb of the lower substrate 41, for example in the same direction.

FIG. 5 is again referenced. The principal surface 41*a* of the lower substrate 41 is provided with a pair of interconnections 46*a* and 46*b* that supplies a drive-electric current as a control signal to the Peltier element 44 and a pair of interconnections 47*a* and 47*b* that supplies a drive-electric current as a control signal to the Peltier element 45. The end parts of the interconnections 46*a* and 46*b* on the opposite side of the Peltier element 44 are connected, respectively, to bonding pads 46*c* and 46*d*. The end parts of the interconnections 47*a* and 47*b* on the opposite side of the Peltier element 45 are connected, respectively, to bonding pads 47*c* and 47*d*. The bonding pads 46*c*, 46*d*, 47*c*, and 47*d* are disposed in the direction D2 to the Peltier element 44, and arranged in this order along the side edge of the principal surface 41*a* extending along the direction D1. The pair of interconnections 47*a* and 47*b* connecting the bonding pads 47*c* and 47*d* to the Peltier element 45 extends along the side edge of the principal surface 41*a* in the direction D1, and passes along the side of the metal pattern 48. That is, the interconnections 47*a* and 47*b* are disposed side by side with the metal pattern 48 (the fastening region) in the direction D2.

As shown in FIG. 6, the back surface 50*b* of the middle block 50 has a region A in which the metal pattern 51 is not provided (in other words, the back surface 50*b* of the middle block 50 is exposed). The region A is located close to another end 50*bb* of the back surface 50*b* in the direction D2, and arranged on the side of the other end 50*bb* to the metal pattern 51. In the state in which the middle block 50 is disposed on the principal surface 41*a* of the lower substrate 41, the part forming the region A is located on the interconnections 47*a* and 47*b* in the middle block 50, and covers the interconnections 47*a* and 47*b*. Since the metal pattern 51 is not provided in the region A, the short circuit between the interconnections 47*a* and 47*b* is avoided even in the case in which the region A contacts the interconnections 47*a* and 47*b*.

FIGS. 1, 2, and 3 are again referenced. The package 30 houses the semiconductor laser device 11, the optical modulator 12, the light receiving element 13, and the temperature adjusting device 40. The package 30 has a bottom plate 36 and a wall portion 37. The bottom plate 36 is a member in a plate shape whose planar shape is in a rectangle. The bottom plate 36 is mainly formed of a metal material like CuW or Kovar (an alloy having at least nickel and cobalt mixed iron), for example. One of the substrate surfaces of the bottom plate 36 forms a flat bottom surface 36*a* defining the internal space of the package 30. The temperature adjusting device 40 is disposed on the bottom surface 36*a*, and the back surface 41*b* of the lower substrate 41 is opposite to the bottom surface 36*a*.

The wall portion 37 is provided on the bottom surface 36*a* of the bottom plate 36, and surrounds the semiconductor laser device 11, the optical modulator 12, and the temperature adjusting device 40. The wall portion 37 presents a rectangular frame shape disposed along four edges of the bottom surface 36*a*. That is, the wall portions 37 includes a pair of parts 371 and 372 opposite to each other in the direction D1 and extending along the direction D2 and a pair of parts 373 opposite to each other in the direction D2 and extending along the direction D1. The part 371 is formed holes 37*b* and 37*c* penetrating the part 371 along the direction D1. The holes 37*b* and 37*c* are arranged along the direction D2. The hole 37*b* leads the transmission signal light beam Lb to the outside of the package 30, and the hole 37*c* introduces the reception signal light beam Lc from the outside of the package 30. The wall portion 37 is formed of a dielectric material, for example. The dielectric material is a ceramic, for example, and the ceramic contains at least one of aluminum nitride and alumina, for example.

The wall portion 37 has an installation surface 37*a* on which the light receiving element 13, the mirror 23, the mirror 24, the polarized wave separating filter 27, and the lens array 29 are installed. The installation surface 37*a* extends from the part 373 of the wall portion 37 toward the internal space of the package 30. The installation surface 37*a* is directed to the direction the same as the installation surface 32*a* of the light source base 32, the principal surface 50*a* of the middle block 50, and the installation surface 34*a* of the modulator base 34, extends along the direction D1, and is disposed side by side with the installation surface 32*a*, the principal surface 50*a*, and the installation surface 34*a* in the direction D2. In an example, the installation surface 37*a* is flush with the installation surface 32*a*, the principal surface 50*a*, and the installation surface 34*a*.

The package 30 further has a member 38 in a rectangular frame shape provided on the wall portion 37. The member 38 is made of a metal like Kovar, for example, and is used for fastening a cover part (lid), not shown, to the wall portion 37.

As shown in FIGS. 2 and 3, in order to align the middle block 50 with the package 30, one or a plurality of marks M1 is provided on the edge opposite to the installation surface 37*a* on the principal surface 50*a* of the middle block 50, and one or a plurality of marks M2 corresponding to the marks M1 is provided on the edge opposite to the principal surface 50*a* on the installation surface 37*a* of the package 30. The position of the mark M1 is matches with the position of the mark M2, and thus the relative position of the middle block 50 in the direction D1 in the package 30 is accurately positioned. The marks M1 and M2 are possible to have various shapes including a cross shape, for example.

In order to align the middle block 50 with the semiconductor laser device 11, on the edge opposite to the light source base 32 on the principal surface 50*a* of the middle block 50, one or a plurality of marks M3 is provided, and on the edge opposite to the principal surface 50*a* on the installation surface 32*a* of the light source base 32, one or a plurality of marks M4 corresponding to the mark M3 is provided. The position of the mark M3 is matched with the position of the mark M4, and thus the relative position between the middle block 50 and the light source base 32 in the direction D2 is accurately positioned, resulting in accurately positioning the relative position between the middle block 50 and the semiconductor laser device 11 in the direction D2. In order to align the middle block 50 with the optical modulator 12, on the edge opposite to the modulator base 34 on the principal surface 50*a* of the middle block 50, one or a plurality of marks M5 is provided, and on the edge opposite to the principal surface 50a on the installation surface 34a of the modulator base 34, one or a plurality of marks M6 corresponding to the mark M5 is provided. The position of the mark M5 is matched with the position of the mark M6, and thus the relative position between the middle block 50 and the modulator base 34 in the direction D2 is accurately positioned, resulting in accurately positioning the relative position between the middle block 50 and the optical modulator 12 in the direction D2. The mark M3, M4, M5, and M6 are possible to have various shapes including a cross shape, for example.

Figure 7:
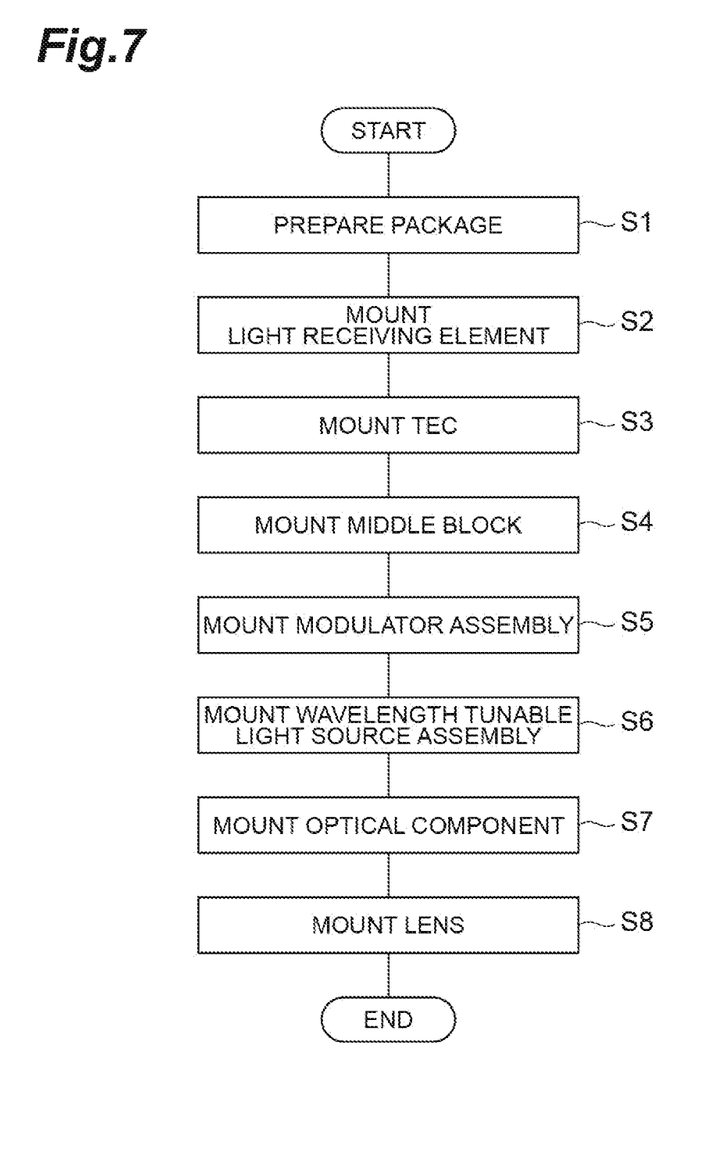
FIG. 7 is a flowchart showing the assembly procedures of the optical transmitter-receiver module.

The assembly procedures of the optical transmitter-receiver module 10 of the present embodiment including the configurations above will be described. FIG. 7 is a flowchart showing the assembly procedures of the optical transmitter-receiver module 10. As shown in FIG. 7, first, as Step S1, the package 30 having the configurations described above is prepared. Subsequently, as Step S2, a light receiving element assembly having the light receiving element 13 installed on the receiving element carrier 35 is mounted on the installation surface 37a of the package 30. Subsequently, as Step S3, the temperature adjusting device 40 is fixed on the bottom surface 36a of the package 30. Subsequently, as Step S4, the middle block 50 is fastened to the principal surface 41a of the lower substrate 41. Subsequently, as Step S5, a modulator assembly having the modulator carrier 33 and the optical modulator 12 installed on the modulator base 34 is fixed on the upper substrate 43 of the temperature adjusting device 40. Subsequently, as Step S6, a wavelength tunable light source assembly having the light source carrier 31 and the semiconductor laser device 11 installed on the light source base 32 is fixed on the upper substrate 42 of the temperature adjusting device 40. Note that the order of Step S5 and S6 may be exchanged. Subsequently, as Step S7, the beam splitter 22, the mirrors 23, 24, and 25, the polarized wave combining filter 26, and the polarized wave separating filter 27 are mounted at predetermined positions. The lens 21 and the lens arrays 28 and 29 are then mounted at a predetermined positions. Lastly, the cover part (lid) of the package 30 is put to hermetically seal the internal space of the package 30. Through the steps above, the optical transmitter-receiver module 10 according to the present embodiment is fabricated.

The effects obtained by the optical transmitter-receiver module 10 according to the present embodiment described above will be described. As described above, in the optical transmitter-receiver module 10, a part of the laser light beam La (the laser light beam La1) emitted from the semiconductor laser device 11 is entered to the optical modulator 12, and the optical modulator 12 modulates the laser light beam La to generate the signal light beams Lb1 and Lb2. The remaining part of the laser light beam La emitted from the semiconductor laser device 11 (the laser light beam La2) is entered to the light receiving element 13, and the light receiving element 13 demodulates the reception signal light beam Lc using the laser light beam La2 (the local emission light beam). The Peltier element 44 controls the temperature of the semiconductor laser device 11 to control the wavelength of the laser light beam La, and the Peltier element 45 keeps the temperature of the optical modulator 12 at constant to suppress fluctuations in the characteristics of the optical modulator 12. As described above, the Peltier elements 44 and 45 independently perform temperature control over the semiconductor laser device 11 and the optical modulator 12, and thus it is possible to highly accurately control these temperatures. In the optical transmitter-receiver module 10, the middle block 50 is disposed between the Peltier element 44 and the Peltier element 45, and the back surface 50b is directly or indirectly fastened to the principal surface 41a of the lower substrate 41. Therefore, the middle block 50 restrains warpage due to temperature fluctuations in the lower substrate 41 on which the Peltier elements 44 and 45 are installed (specifically, the warpage of the part between the Peltier element 44 and the Peltier element 45), and thus a reduction in the warpage of the lower substrate 41 is enabled. Accordingly, a reduction in the relative inclination between the optical axis of the semiconductor laser device 11 and the optical axis of the optical modulator 12 due to temperature fluctuations is enabled, and thus surpassing fluctuations in the efficiency of optical coupling of these components is enabled. A reduction in stress produced in the Peltier elements 44 and 45 due to the warpage of the lower substrate 41 is enabled, and thus improving the reliability of the Peltier elements 44 and 45 is enabled.

As in the present embodiment, the length Ea of the metal pattern 48 (the fastening region) in the direction D1 may be 10% or more and 50% or less of the length Eb of the lower substrate 41 in the same direction. The length Ea of the metal pattern 48 (the fastening region) is 10% or more of the length Eb of the lower substrate 41, and thus the middle block 50 enables effective restraint on the warpage of the lower substrate 41. The length Ea of the metal pattern 48 (the fastening region) is 50% or less of the length Eb of the lower substrate 41, and thus this enables a sufficient reservation of the space in which the Peltier elements 44 and 45 are disposed on the principal surface 41a of the lower substrate 41.

As in the present embodiment, a configuration may be provided in which the metal pattern 48 is provided on the principal surface 41a of the lower substrate 41, the metal pattern 51 is provided on the back surface 50b of the middle block 50, and the metal pattern 48 and the metal pattern 51 are fastened to each other through a metal joining material. In this case, the middle block 50 is firmly fastened to the lower substrate 41, the peeling of the middle block 50 off the lower substrate 41 due to the warpage of the lower substrate 41 is avoided, and thus an effective restraint on the warpage of the lower substrate 41 is enabled.

As in the present embodiment, the width Wa of the metal pattern 48 (the fastening region) in the direction orthogonal to the direction D1 (e.g. in the direction D2) may be 50% or more of the width Wb of the lower substrate 41 in the same direction. The width Wa of the metal pattern 48 (the fastening region) is 50% or more of the width Wb of the lower substrate 41, and thus the middle block 50 enables effective restraint on the warpage of the lower substrate 41.

As in the present embodiment, the marks M3 and M5 that align the semiconductor laser device 11 and the optical modulator 12 with the middle block 50 may be provided on the principal surface 50a of the middle block 50. In this case, it is possible to highly accurately align the relative position between the semiconductor laser device 11 and the optical modulator 12 having an increased spacing to each other with interposed the middle block 50.

As in the present embodiment, the marks M1 and M2 that align the middle block 50 with the package 30 may be provided on the principal surface 50a of the middle block 50 and the installation surface 37a of the package 30. In this case, it is possible to highly accurately align the relative position of the middle block 50 to the package 30, resulting in highly accurately optically coupling the light receiving element 13 to the semiconductor laser device 11 disposed on the installation surface 37a of the package 30.

As in the present embodiment, a configuration may be provided in which the temperature adjusting device 40 has the interconnections 47a and 47b that supply the control signal to at least one of the Peltier elements 44 and 45 on the principal surface 41a of the lower substrate 41, the interconnections 47a and 47b are disposed side by side with the metal pattern 48 (the fastening region) in the direction D2, and the middle block 50 includes the part that covers the interconnections 47a and 47b. In this case, an increase in the area of the middle block 50 is enabled, and thus this enables a sufficient reservation of a space in which the optical component such as the beam splitter 22 is disposed on the principal surface 50a of the middle block 50.

As in the present embodiment, the installation surface 32a of the light source base 32, the principal surface 50a of the middle block 50, and the installation surface 34a of the modulator base 34 may be flush with each other. In this case, the highly accurate alignment of the optical axes of the semiconductor laser device 11 and the optical modulator 12 in the height direction (in the normal direction of the principal surface 41a of the lower substrate 41) is enabled. In the present embodiment, since the lower substrate 41 is shared between the Peltier elements 44 and 45, a reduction in variations in the height between the upper substrates 42 and 43 is enabled, resulting in enabling a reduction in variations in the height between the installation surfaces 32a and 34a. Accordingly, a reduction in variations in the coupling efficiency of the semiconductor laser device 11 to the optical modulator 12 is enabled.

As in the present embodiment, a configuration may be provided in which an optical component (the beam splitter 22) that branches the laser light beam La emitted from the semiconductor laser device 11 is disposed on the principal surface 50a of the middle block 50, the one laser light beam La1 of the branched laser light beam La is entered to the optical modulator 12, and the other laser light beam La2 is entered to the light receiving element 13. Such an optical component is disposed on the principal surface 50a of the middle block 50, and thus efficient use of the space on the middle block 50 is enabled. Note that on the principal surface 50a of the middle block 50, another optical component may be disposed, instead of the beam splitter 22, or together with the beam splitter 22.

(First Exemplary Modification)

In the configuration of the optical transmitter-receiver module 10 of the embodiment, the configurations except the light receiving element 13, the beam splitter 22, the mirrors 23, 24, and 25, the polarized wave separating filter 27, and the lens array 29 are usable as an optical transmitter module. Even such an optical transmitter module is possible to exert the effect similar to the optical transmitter-receiver module 10 of the embodiment except the effect relating to the light receiving element 13.

(Second Exemplary Modification)

In the embodiment, the principal surface 41a of the lower substrate 41 is fastened to the back surface 50b of the middle block 50 using a metal joining material such as solder. However, the fastening method for the principal surface 41a and the back surface 50b is not limited to the metal joining material. For example, the principal surface 41a may be fastened to the back surface 50b through a resin. In this case, it is possible to easily fasten the middle block 50 to the lower substrate 41, and it is possible to simplify manufacture processes.

(Third Exemplary Modification)

Figure 8:
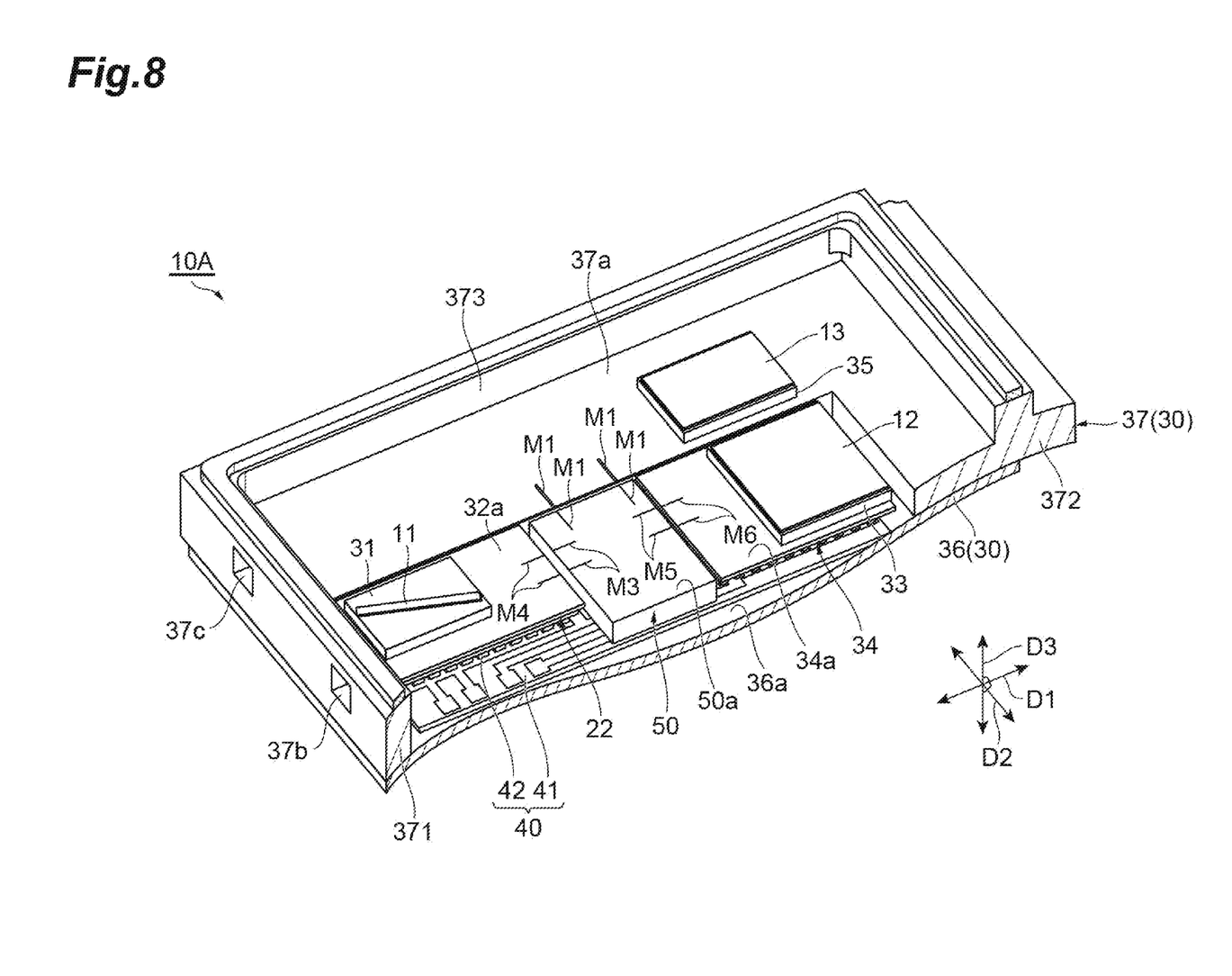
FIG. 8 is a cutaway perspective view showing the configuration of an optical transmitter-receiver module according to a third exemplary modification.
Figure 9:
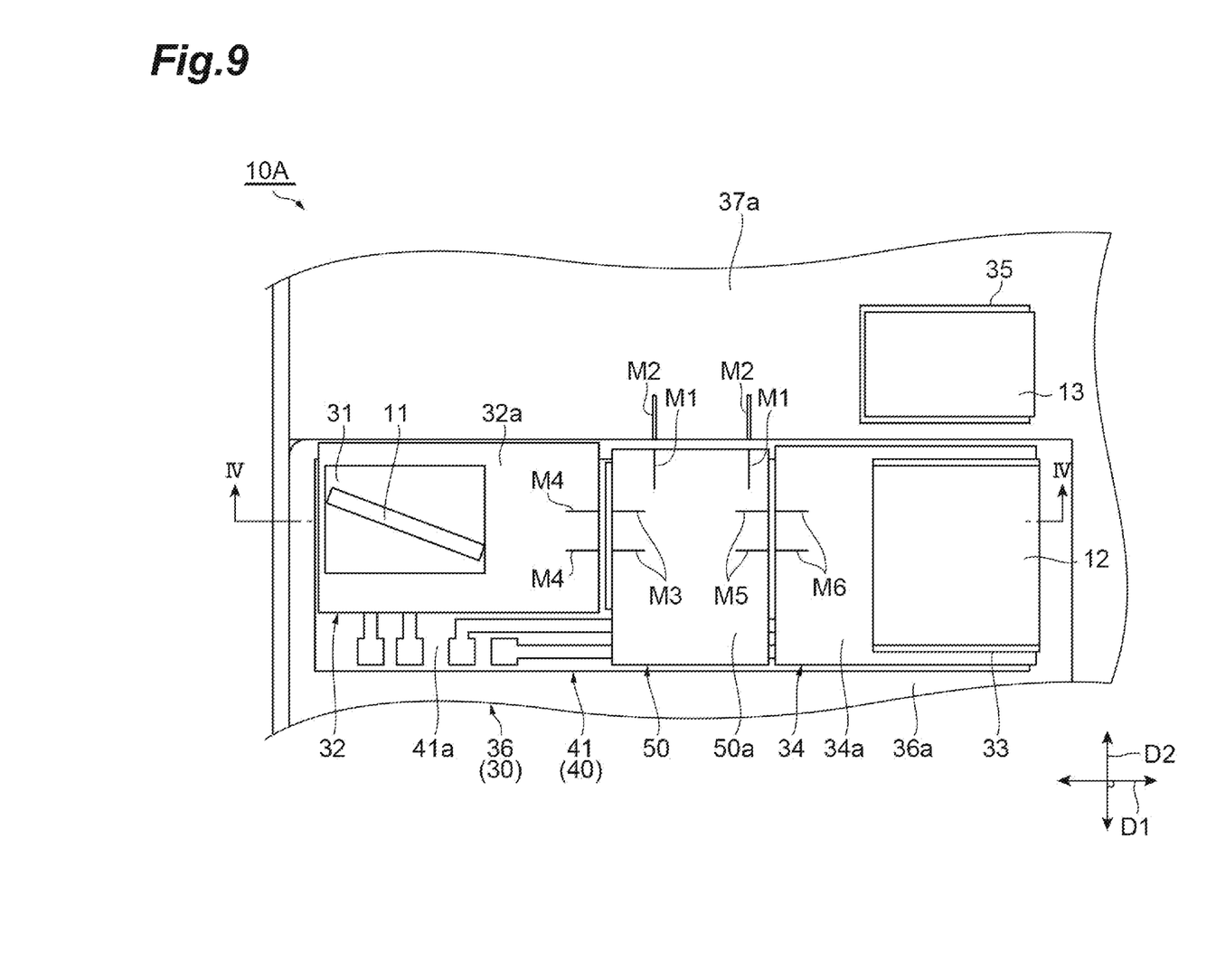
FIG. 9 is a plan view showing the configuration of the optical transmitter-receiver module according to the third exemplary modification.

FIGS. 8 and 9 are views showing the configuration of an optical transmitter-receiver module 10A according to a third exemplary modification of the embodiment. FIG. 8 is a cutaway perspective view of the optical transmitter-receiver module 10A, and FIG. 9 is a plan view of the optical transmitter-receiver module 10A. Note that in FIGS. 8 and 9, the lens 21, the beam splitter 22, the mirrors 23, 24, and 25, the polarized wave combining filter 26, the polarized wave separating filter 27, and the lens arrays 28 and 29 are omitted.

The difference of the present exemplary modification from the embodiment is the shapes of the marks M1, M2, M3, M4, M5, and M6. In the present exemplary modification, the marks M1, M2, M3, M4, M5, and M6 present a linear shape extending in the direction intersecting with the edges of the principal surface 50a of the middle block 50, not in a cross shape. Even such a shape is possible to exert the effect similar to the embodiment.

The optical transmitter module, the optical transmitter-receiver module, and the optical module according to the present disclosure are not limited to the foregoing embodiment, and various modifications are further possible. For example, in the optical module according to the present disclosure, the semiconductor laser device 11 is exemplified as the first optical element, and the optical modulator 12 is exemplified as the second optical element. However, various optical elements are further applicable as these optical elements.

What is claimed is:

1. An optical transmitter module comprising:
   a semiconductor laser device;
   an optical modulator optically coupled to the semiconductor laser device;
   a temperature adjusting device having a substrate having a principal surface and a back surface, a first installation part provided on the principal surface of the substrate through a first temperature controlling element, the first installation part having the semiconductor laser device installed on the first installation part, and a second installation part provided on the principal surface of the substrate through a second temperature controlling element, the second installation part having the optical modulator installed on the second installation part;
   a package having a bottom surface opposite to the back surface of the substrate, the package housing the semiconductor laser device, the optical modulator, and the temperature adjusting device; and
   a middle block disposed between the first temperature controlling element and the second temperature controlling element, the middle block having a back surface directly or indirectly fastened to the principal surface of the substrate.

2. The optical transmitter module according to claim 1, wherein a length of a fastening region in which the principal surface of the substrate is fastened to the middle block in an arranging direction of the first installation part, the middle block, and the second installation part is 10% or more and 50% or less of a length of the substrate in the arranging direction.

3. The optical transmitter module according to claim 1, wherein a width of a fastening region in which the principal surface of the substrate is fastened to the middle block in a direction orthogonal to an arranging direction of the first installation part, the middle block, and the second installation part is 50% or more of a width of the substrate in the arranging direction.

4. The optical transmitter module according to claim 1, wherein a first metal film is provided on the principal surface of the substrate,
a second metal film is provided on the back surface of the middle block, and
the first metal film is fastened to the second metal film through a metal joining material.

5. The optical transmitter module according to claim 1, wherein the principal surface of the substrate is fastened to the back surface of the middle block through a resin.

6. The optical transmitter module according to claim 1, wherein on the principal surface of the middle block, a mark aligning the semiconductor laser device and the optical modulator with the middle block is provided.

7. The optical transmitter module according to claim 1, wherein the temperature adjusting device has an interconnection supplying a control signal to at least one of the first and second temperature controlling element on the principal surface of the substrate,
the interconnection is disposed side by side with the fastening region in which the principal surface of the substrate is fastened to the middle block in the direction intersecting with the arranging direction of the first installation part, the middle block, and the second installation part, and
the middle block includes a part covering the interconnection.

8. The optical transmitter module according to claim 1, further comprising
a first base member having an installation surface on which the semiconductor laser device is installed and a back surface directed to an opposite side of the installation surface, and
a second base member having an installation surface on which the optical modulator is installed and a back surface directed to an opposite side of the installation surface, wherein
the middle block has a principal surface directed to an opposite side of the back surface,
the back surface of the first base member is fixed to the first installation part,
the back surface of the second base member is fixed to the second installation part, and
the installation surface of the first base member, the principal surface of the middle block, and the installation surface of the second base member are flush with each other.

9. An optical transmitter-receiver module comprising:
a semiconductor laser device;
an optical modulator optically coupled to the semiconductor laser device;
a light receiving element optically coupled to the semiconductor laser device;
a temperature adjusting device having a substrate having a principal surface and a back surface, a first installation part provided on the principal surface of the substrate through a first temperature controlling element, the first installation part having the semiconductor laser device installed on the first installation part, and a second installation part provided on the principal surface of the substrate through a second temperature controlling element, the second installation part having the optical modulator installed on the second installation part,
a package having a bottom surface opposite to the back surface of the substrate, the package housing the semiconductor laser device, the optical modulator, the light receiving element, and the temperature adjusting device; and
a middle block disposed between the first temperature controlling element and the second temperature controlling element, the middle block having a back surface directly or indirectly fastened to the principal surface of the substrate.

10. The optical transmitter-receiver module according to claim 9,
wherein the middle block has a principal surface directed to an opposite side of the back surface,
on the principal surface of the middle block, an optical component is disposed, the optical component branching an emission light beam from the semiconductor laser device, and
one of the emission light beams having been branched is entered to the optical modulator, and another of the emission light beams having been branched is entered to the light receiving element.

11. The optical transmitter-receiver module according to claim 9,
wherein the middle block has a principal surface directed to an opposite side of the back surface,
the package has an installation surface provided side by side with the principal surface of the middle block, the installation surface on which the light receiving element is installed, and
on the principal surface of the middle block and the installation surface of the package, a mark aligning the middle block with the package is provided.

12. An optical module comprising:
a first optical element and a second optical element optically coupled to each other;
a temperature adjusting device having a substrate having a principal surface and a back surface, a first installation part provided on the principal surface of the substrate through a first temperature controlling element, the first installation part having the first optical element installed on the first installation part, and a second installation part provided on the principal surface of the substrate through a second temperature controlling element, the second installation part having the second optical element installed on the second installation part;
a package having a bottom surface opposite to the back surface of the substrate, the package housing the first optical element, the second optical element, and the temperature adjusting device; and
a middle block disposed between the first temperature controlling element and the second temperature controlling element, the middle block having a back surface directly or indirectly fastened to the principal surface of the substrate.

* * * * *